United States Patent
Fukunaga et al.

(10) Patent No.: US 9,825,027 B1
(45) Date of Patent: Nov. 21, 2017

(54) SEMICONDUCTOR DEVICE

(71) Applicant: SANKEN ELECTRIC CO., LTD., Niiza-shi, Saitama (JP)

(72) Inventors: Shunsuke Fukunaga, Niiza (JP); Taro Kondo, Niiza (JP)

(73) Assignee: Sanken Electric Co., LTD., Niiza-shi, Saitama (JP)

( * ) Notice: Subject to any disclaimer, the term of this patent is extended or adjusted under 35 U.S.C. 154(b) by 0 days.

(21) Appl. No.: 15/412,035

(22) Filed: Jan. 22, 2017

(51) Int. Cl.
*H01L 27/06* (2006.01)
*H01L 29/78* (2006.01)
*H01L 29/872* (2006.01)

(52) U.S. Cl.
CPC ...... *H01L 27/0629* (2013.01); *H01L 29/7813* (2013.01); *H01L 29/8725* (2013.01)

(58) Field of Classification Search
CPC .......................... H01L 27/0705; H01L 27/0629
See application file for complete search history.

(56) References Cited

U.S. PATENT DOCUMENTS

| | | | |
|---|---|---|---|
| 2005/0167742 A1* | 8/2005 | Challa | H01L 21/3065 257/328 |
| 2007/0267672 A1* | 11/2007 | Hokomoto | H01L 29/1095 257/301 |
| 2012/0126249 A1* | 5/2012 | Nakano | H01L 29/45 257/77 |
| 2016/0043000 A1 | 2/2016 | Rieger | |

* cited by examiner

*Primary Examiner* — Olik Chaudhuri
*Assistant Examiner* — Lamont Koo
(74) *Attorney, Agent, or Firm* — Banner & Witcoff, Ltd.

(57) ABSTRACT

A semiconductor device has a plurality of transistors, which have first electrodes in first trenches, and includes: two second trenches, which are formed side by side between the first trenches. A second electrode is formed in each of the two second trenches. A first impurity region is formed between the first trench and the second trench; a second impurity region is formed to abut on the first trench; a third impurity region is formed to abut on the second trench; a fourth impurity region, which is formed between two of the second trenches and has a higher impurity concentration than the first impurity region; and a fifth impurity region is formed below the first impurity region and the fourth impurity region. A third electrode is formed to be electrically connected to the first impurity region, the second impurity region, the third impurity region, and the fourth impurity region.

7 Claims, 1 Drawing Sheet

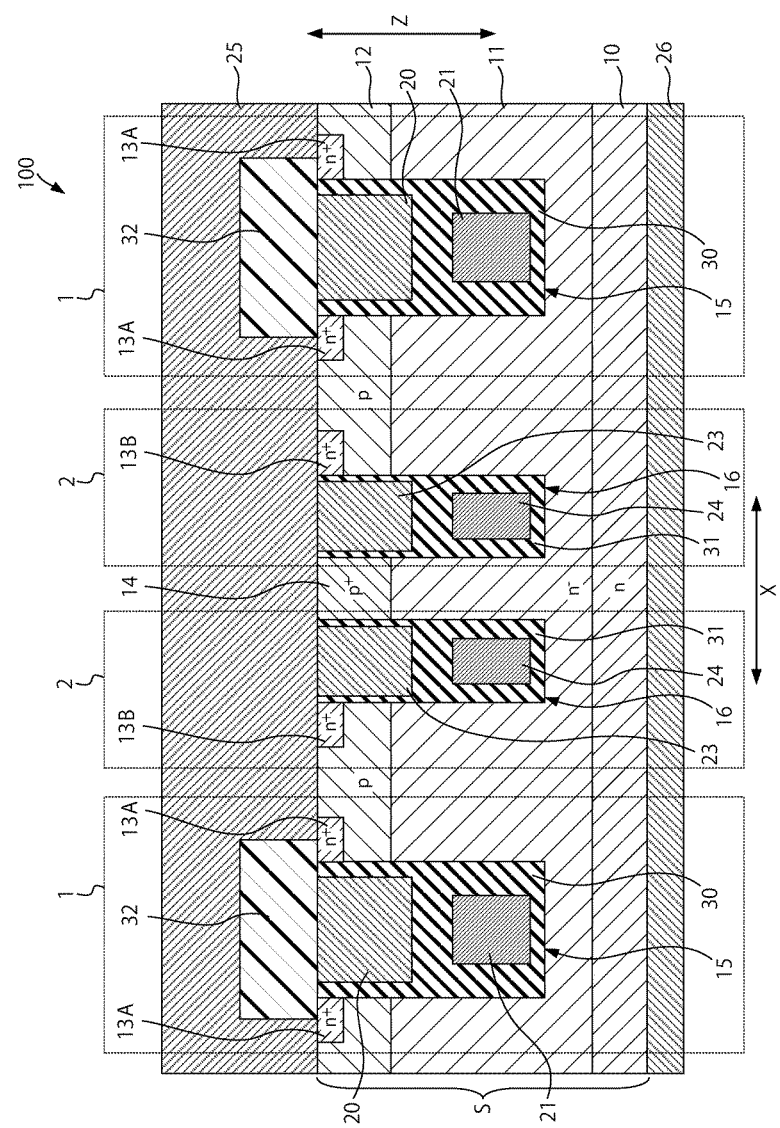

SEMICONDUCTOR DEVICE

TECHNICAL FIELD

This disclosure relates to a semiconductor device.

BACKGROUND

There is a semiconductor device such as a power metal-oxide-semiconductor field-effect transistor (MOSFET) or an insulated gate bipolar transistor (IGBT) in which a gate electrode and a gate insulating film are formed on an inner wall of a trench formed in a front surface of a semiconductor substrate.

A semiconductor device is disclosed in US 2016/0043000 in which a trench buried with a gate electrode of an MOS diode is formed between trenches buried respectively with gate electrodes of two MOSFETs adjacent to each other and formed in a semiconductor substrate.

SUMMARY

In the configuration as in the semiconductor device disclosed in US 2016/0043000 in which the MOS diode is formed between the MOSFETs, a current path extending to a front surface of the semiconductor substrate from a back surface of the semiconductor substrate is narrowed by the MOS diode. In this way, as the current path is narrowed, avalanche resistance is reduced.

This disclosure is to provide a semiconductor device in which avalanche resistance can be improved.

A semiconductor device of this disclosure has a plurality of transistors, which are arranged in one direction and have first electrodes in first trenches formed in a front surface of a semiconductor substrate, and the semiconductor device includes: two second trenches, which are formed side by side between the first trenches of adjacent two of the transistors in the one direction, on the front surface of the semiconductor substrate; a second electrode, which is formed in each of the two second trenches; a first impurity region, which has a first conductivity type and is formed between the first trench and the second trench adjacent to the first trench, in the front surface of the semiconductor substrate; a second impurity region, which has a second conductivity type and is formed to abut on the first trench in a surface of the first impurity region, the second conductivity type being opposite to the first conductivity type; a third impurity region, which has the second conductivity type and is formed to abut on the second trench in the surface of the first impurity region; a fourth impurity region, which has the first conductivity type and is formed between the two of the second trenches on the front surface of the semiconductor substrate and has a higher impurity concentration than the first impurity region; a fifth impurity region, which has the second conductivity type and is formed below the first impurity region and the fourth impurity region; and a third electrode, which is formed on the front surface of the semiconductor substrate and is electrically connected to the first impurity region, the second impurity region, the third impurity region, and the fourth impurity region.

According to this disclosure, it is possible to provide a semiconductor device in which avalanche resistance can be improved.

BRIEF DESCRIPTION OF THE DRAWINGS

The foregoing and additional features and characteristics of this disclosure will become more apparent from the following detailed descriptions considered with the reference to the accompanying drawings, wherein:

FIG. 1 is a schematic cross-sectional view partially illustrating a schematic configuration of a semiconductor device 100 according to an embodiment of this disclosure.

DETAILED DESCRIPTION

An embodiment of this disclosure will be described below with reference to the accompanying drawing.

FIG. 1 is a schematic cross-sectional view partially illustrating a schematic configuration of a semiconductor device 100 according to an embodiment of this disclosure.

The semiconductor device 100 has a configuration in which a plurality of MOSFETs 1 having a trench structure are arranged in one direction X.

The semiconductor device 100 includes a semiconductor substrate S made of a semiconductor such as silicon, silicon carbide (SiC), or gallium nitride (GaN). The material of the semiconductor substrate S is not limited thereto.

The semiconductor substrate S includes a front surface serving as an upper surface in FIG. 1 and a back surface serving as a lower surface in FIG. 1. In the following description, out of a thickness direction Z being an aligned direction of the back surface and the front surface of the semiconductor substrate S, a direction toward the front surface from the back surface is defined as an upward direction, and a direction toward the back surface from the front surface is defined as a downward direction.

The semiconductor substrate S includes an n-type substrate 10, an n-type drift region 11 that is formed on the substrate 10 and has a lower impurity concentration than the substrate 10, a body region 12 that is formed on the drift region 11 and includes a p-type impurity region, a source region 13A and a source region 13B that are formed in the surface of the body region 12 and include an n-type impurity region having a higher impurity concentration than the drift region 11, and a p-type impurity region 14 that is formed on the front surface of the semiconductor substrate S and has a higher impurity concentration than the body region 12. Each of the drift region 11 and the body region 12 may be configured to have a structure in which a plurality of layers having different impurity concentrations are laminated.

The body region 12 constitutes a first impurity region. The source region 13A constitutes a second impurity region. The source region 13B constitutes a third impurity region. The impurity region 14 constitutes a fourth impurity region. The drift region 11 constitutes a fifth impurity region.

The semiconductor device 100 includes a plurality of first trenches 15 that are formed side by side in the direction X on the front surface of the semiconductor substrate S and two second trenches 16 that are formed side by side in the direction X between the adjacent two first trenches 15 on the front surface of the semiconductor substrate S.

The first trench 15 reaches the interior of the drift region 11 from the front surface of the semiconductor substrate S and extends in a direction perpendicular to each of the direction X and the thickness direction Z.

In the first trench 15, a field plate electrode 21 is formed at a backward in the semiconductor substrate S, and a gate electrode 20 of a first electrode is formed above the field plate electrode 21. In addition, an insulating film 30 is formed between an inner wall of the first trench 15 and each of the field plate electrode 21 and the gate electrode 20. In the first trench 15, the field plate electrode 21 is not essential and it may be omitted.

The second trench 16 reaches the interior of the drift region 11 from the front surface of the semiconductor substrate S, and extends in the direction perpendicular to each of the direction X and the thickness direction Z.

In the second trench 16, a field plate electrode 24 is formed at a backward in the semiconductor substrate S, and a gate electrode 23 of a second electrode is formed above the field plate electrode 24. The gate electrode 23 has a structure in which an upper end thereof is exposed on the front surface of the semiconductor substrate S. In addition, an insulating film 31 is formed between an inner wall of the second trench 16 and the field plate electrode 24 and the gate electrode 23. In the second trench 16, the field plate electrode 24 is not essential, and it may be omitted.

The p-type body region 12 is formed between the first trench 15 and the second trench 16 adjacent thereto on the front surface of the semiconductor substrate S. A lower end of each of the gate electrode 20 and the gate electrode 23, which are formed in the first trench 15 and the second trench 16 to hold the body region 12 is located below a lower end of the body region 12.

On the surface of the body region 12 formed between the first trench 15 and the second trench 16 adjacent thereto, the source region 13A abuts on the first trench 15, and the source region 13B abuts on the second trench 16. The source region 13A and the source region 13B are formed separately from each other in the direction X and have the same impurity concentration.

The impurity region 14 is formed between the adjacent two second trenches 16 on the front surface of the semiconductor substrate S. A lower end of the impurity region 14 is located above (frontwards of the front surface of the semiconductor substrate S) the lower end of the gate electrode 23 formed in the second trench 16. The drift region 11 is formed below the impurity region 14. The impurity region 14 is formed by ion implantation or electron beam irradiation with respect to the body region 12, for example.

In order to achieve a low resistance, the impurity region 14 has a sufficiently higher impurity concentration than the body region 12. The impurity concentration of the impurity region 14 is preferably equal to or more than 10 times as high as the impurity concentration of the body region 12.

An area (a plane area) of the impurity region 14 in a plan view seen from the direction Z is not particularly limited, but is preferably smaller than a plane area of the body region 12 formed between the first trench 15 and the second trench 16 adjacent thereto.

Specifically, the plane area of the impurity region 14 is preferably from 0.25 times or more to 0.5 times or less as large as the plane area of the body region 12 formed between the first trench 15 and the second trench 16 adjacent thereto.

The semiconductor device 100 also includes a drain electrode 26 that is formed on the back surface of the semiconductor substrate S and is made of a metal such as aluminum or a metal alloy, an interlayer insulating film 32 such as a BPSG (Boron Phosphorus Silicon Glass) film or a PSG film that is formed on the front surface of the semiconductor substrate S to cover the gate electrode 20 and portions of the source regions 13A and 13B, and a source electrode 25 that is formed on the front surface of the semiconductor substrate S and on the surface of the interlayer insulating film 32 and is made of a metal such as aluminum or a metal alloy.

The source electrode 25 is electrically connected to the source region 13A, the source region 13B, the body region 12, the impurity region 14, and the gate electrode 23 which are exposed on the front surface of the semiconductor substrate S. The source electrode 25 constitutes a third electrode.

Each of the source region 13A, the source region 13B, the body region 12, and the impurity region 14 has a range of impurity concentration where an ohmic contact with the source electrode 25 is realized.

In the first trench 15, the gate electrode 20 is formed at an overlapping position with the body region 12 as viewed in the direction X, and thus an applied voltage is controlled. The gate electrode 20 is made of a conductive material such as a metal, a metal alloy, or polysilicon.

By the control of the voltage to be applied to the gate electrode 20, a channel is formed in the body region 12 adjacent to the first trench 15, and charges can be transferred to the drain electrode 26 from the source region 13A adjacent to the first trench 15 through the drift region 11 and the substrate 10.

The field plate electrode 21 formed in the first trench 15 is connected to the source electrode 25 at the same potential or is in a floating state, and has a function to relax concentration of an electric field in the vicinity of the gate terminal. The field plate electrode 21 is made of a conductive material such as a metal, a metal alloy, or a polycrystal semiconductor such as polysilicon.

In the first trench 15, the insulating film 30 is made of, for example, an oxide film made of silicon dioxide, a nitride film made of silicon nitride, or a mixed film of the oxide film and the nitride film.

The MOSFET 1 is configured with the gate electrode 20, the field plate electrode 21, and the insulating film 30 which are formed in the first trench 15, the source region 13A adjacent to the first trench 15 and the body region 12, the drift region 11 and the substrate 10 which are located below the body region 12, the source electrode 25, and the drain electrode 26.

In the second trench 16, the gate electrode 23 is formed at an overlapping position with the body region 12 as viewed in the direction X, and is fixed to the source region 13 and the body region 12 at the same potential. The gate electrode 23 is made of a conductive material such as a metal, a metal alloy, or a polycrystal semiconductor such as polysilicon.

The field plate electrode 24 formed in the second trench 16 is connected to the source electrode 25 at the same potential or is in a floating state, and has a function to relax concentration of an electric field in the vicinity of the gate terminal. The field plate electrode 24 is made of a conductive material such as a metal, a metal alloy, or polysilicon.

In the second trench 16, the insulating film 31 is made of, for example, an oxide film made of silicon dioxide, a nitride film made of silicon nitride, or a mixed film of the oxide film and the nitride film.

An MOS diode 2 is configured with the gate electrode 23, the field plate electrode 24, and the insulating film 31 which are formed in the second trench 16, the source region 13B adjacent to the second trench 16 and the body region 12, the drift region 11 and the substrate 10 which are located below the body region 12, the source electrode 25, and the drain electrode 26.

In the MOS diode 2, a current can flow into the drain electrode 26 from the source electrode 25 in a state where the MOSFET 1 is turned off.

In FIG. 1, a preferred structure is illustrated in which the gate electrode 20 is made of a metal or a metal alloy, and the gate electrode 23 is made of a polycrystal semiconductor such as polysilicon.

When the gate electrode 20 is made of a metal or a metal alloy, there is no concern for reduction in resistance due to the decrease of the size, and thus the width of the gate electrode 20 can be made as small as possible in the direction X to the extent that desired electric characteristics are obtained. In such a configuration, it is preferable to increase the thickness of the insulating film 30 in the direction X so as to prevent ion diffusion from the gate electrode 20 to the semiconductor substrate S.

When the gate electrode 23 is made of a polycrystal semiconductor such as polysilicon, since there is no concern for ion diffusion into the semiconductor substrate S and the MOS diode 2 does not affect the electric characteristics of the MOSFET 1, the width of the gate electrode 23 can be made as narrow as possible in the direction X and the thickness of the insulating film 31 can be made as small as possible in the direction X.

In FIG. 1, the width of the gate electrode 23 is narrower than the width of the gate electrode 20 in the direction X. The width of the insulating film 31 between sidewalls of the second trench 16 and the gate electrode 23 is narrower than the width of the insulating film 30 between sidewalls of the first trench 15 and the gate electrode 20. Thus, it is possible to achieve both of reduction in on-resistance and improvement of switching performance as well as the decrease of the size.

In the semiconductor device 100 configured as above, since the impurity region 14 of the low resistance is formed between two second trenches 16 adjacent to each other, holes can be easily extracted toward the source electrode 25 from the drain electrode 26 through the impurity region 14. As a result, it is possible to improve avalanche resistance.

Furthermore, according to the configuration in which the impurity concentration of the impurity region 14 is equal to or more than 10 times as high as the impurity concentration of the body region 12, it is possible to more significantly obtain the extraction effect of holes and further improve avalanche resistance.

According to the configuration in which the plane area of the impurity region 14 is smaller than the plane area of the body region 12, it is possible to improve avalanche resistance while realizing easily desired electric characteristics of the MOSFET 1.

According to the configuration in which the lower end of the impurity region 14 is located above the lower end of the gate electrode 23, a depletion layer can be prevented from reaching the impurity region 14, and thus it is possible to improve a withstand voltage of the semiconductor device 100.

The semiconductor device 100 has the configuration in which the entire upper surface of the impurity region 14 is exposed on the front surface of the semiconductor substrate S and the exposed portion is covered with the source electrode 25. Accordingly, it is possible to obtain excellent extraction characteristics of charges through the impurity region 14 and improve avalanche resistance.

In the semiconductor device 100, since a current path can be ensured as in the related art when the MOSFET 1 is turned off, it is possible to obtain the same effect as that of the related art. The plane area of the impurity region 14 may be enough as long as the current path can be obtained, and there is no need to so large. Therefore, it is possible to improve avalanche resistance without hindering the decrease in the size of the semiconductor device 100.

As the transistor included in the semiconductor device 100, the MOSFET is exemplified in the above description. However, even when the transistor is an IGBT, the similar effects can be obtained with the similar configuration.

In addition, even when the semiconductor device 100 is configured such that the p-type and the n-type of the impurity region in the semiconductor substrate S are reversed, the similar effects can be obtained.

What is claimed is:

1. A semiconductor device having a plurality of transistors, which are arranged in one direction and have first electrodes in first trenches formed in a front surface of a semiconductor substrate, the semiconductor device comprising:
   two second trenches, which are formed side by side between the first trenches of two adjacent transistors in the one direction, on the front surface of the semiconductor substrate;
   a second electrode, which is formed in each of the two second trenches;
   a first impurity region, which has a first conductivity type and is formed between the first trench and the second trench adjacent to the first trench, in the front surface of the semiconductor substrate;
   a second impurity region, which has a second conductivity type and is formed to abut on the first trench, in a surface of the first impurity region, the second conductivity type being opposite to the first conductivity type;
   a third impurity region, which has the second conductivity type and is formed to abut on the second trench, in the surface of the first impurity region;
   a fourth impurity region, which has the first conductivity type and is formed to be in contact with the two second trenches on the front surface of the semiconductor substrate and has a higher impurity concentration than the first impurity region;
   a fifth impurity region, which has the second conductivity type and is formed below the first impurity region and the fourth impurity region; and
   a third electrode, which is formed on the front surface of the semiconductor substrate and is electrically connected to the first impurity region, the second impurity region, the third impurity region, and the fourth impurity region,
   wherein the first impurity region is in contact with both the fifth impurity region and the third electrode, and
   wherein the fourth impurity region is in contact with both the fifth impurity region and the third electrode.

2. The semiconductor device according to claim 1, wherein the impurity concentration of the fourth impurity region is more than 10 times as high as the impurity concentration of the first impurity region.

3. The semiconductor device according to claim 1, wherein the fourth impurity region has a smaller plane area than the first impurity region.

4. The semiconductor device according to claim 3, wherein the plane area of the fourth impurity region is from 0.25 times or more to 0.5 times or less as large as the plane area of the first impurity region.

5. The semiconductor device according to claim 1, wherein the impurity concentration of the fourth impurity region has a concentration in a range where an ohmic contact with the third electrode is formed.

6. The semiconductor device according to claim 1, wherein a surface of the fourth impurity region is entirely covered with the third electrode.

7. The semiconductor device according to claim 1, wherein the fourth impurity region has a lower end located further toward the front surface of the semiconductor substrate than a lower end of the second electrode.

\* \* \* \* \*